Jan. 26, 1965 M. L. JONES ETAL 3,167,717

PULSE GENERATOR WITH OUTPUT AMPLIFIER CONTROLLED BY RESPECTIVE SEQUENTIALLY PULSED DRIVER-AMPLIFIERS CONTROLLING LEADING AND TRAILING EDGES

Filed Dec. 17, 1962

INVENTORS
ABEL JACOB SAVAGE
BY MARTIN L. JONES

H. H. Losche
ATT'YS.

3,167,717

PULSE GENERATOR WITH OUTPUT AMPLIFIER CONTROLLED BY RESPECTIVE SEQUENTIALLY PULSED DRIVER-AMPLIFIERS CONTROLLING LEADING AND TRAILING EDGES

Martin L. Jones, Baltimore, and Abel J. Savage, Randallstown, Md., assignors, by mesne assignments, to the United States of America as represented by the Secretary of the Navy

Filed Dec. 17, 1962, Ser. No. 245,331
13 Claims. (Cl. 328—61)

This invention relates to pulse generators and more particularly to pulse generators capable of producing square wave pulses with a flat top and extremely fast rise and fall time leading and trailing edges approaching true square waves.

There is an ever increasing need to produce fast rise and fall time square wave pulses with flat tops to approach the perfect square wave pulse in which the leading and trailing edges are parallel and in which the flat top is normal to the edges. This perfect square wave pulse has not been accomplished since electronic equipment inherently requires time in a sequence of operations to produce the wave. While many generators are known and commonly called "square wave generators," these have only approached the generation of perfect square waves by developing the leading and trailing edges within a few microseconds to produce what appears to be a square wave but what is in fact a trapezoidal wave or, at best, an isosceles trapezoidal wave.

In the present invention a high output, good quality square wave is generated in a novel circuit combination to decrease the rise time to a range from six to twenty nanoseconds and the fall time to a range from fifteen to thirty nanoseconds. In this invention the square wave pulse generator is triggered by positive and negative pulse signals in sequence which may be produced from the differentiation of a generally applied square wave of adjustable width. The positive and negative pulse signals are applied through an input transformer with two oppositely poled secondaries to two driver circuits. One driver circuit will amplify only the positive input signal while the other driver circuit amplifies only the negative input pulse, both driver circuits producing amplified positive pulses in the same time sequence as the input positive and negative pulse signals. Each driver includes an amplifier transformer coupled to a blocking oscillator to produce fast rise times for the two pulses. The output from the driver circuit producing the first pulse in sequence is coupled through a transformer to an output amplifier coupled as a blocking oscillator with a cathode follower output. The output amplifier has a damping circuit coupled to the grid input to dampen out overshoots of the input pulse, and a discharging circuit is coupled between this grid and the output of the other driver circuit to discharge and render nonconductive the output amplifier upon the application of the negative input pulse signal to the input transformer. A holding circuit is coupled across the grid and cathode output of the output amplifier to hold the cathode output voltage at a voltage rise level until discharged by the discharge circuit. Upon discharge or cutoff of the output amplifier, a pulse amplifier coupled between the grid and cathode output operates to accelerate or speed up the discharge rate to complete the trailing edge to the output square wave in the minimum of time. It is therefore a general object of this invention to provide a square wave generator, triggered by trigger pulses coextensive in time with the duration of the output square wave, that develops exceedingly fast rise and fall time leading and trailing edges with a connecting flat top closely approaching a true square wave.

These and other objects and the attendant advantages, features, and uses may became more apparent to those skilled in the art as the description proceeds when considered along with the accompanying drawing in which.

Figures 1, 2:
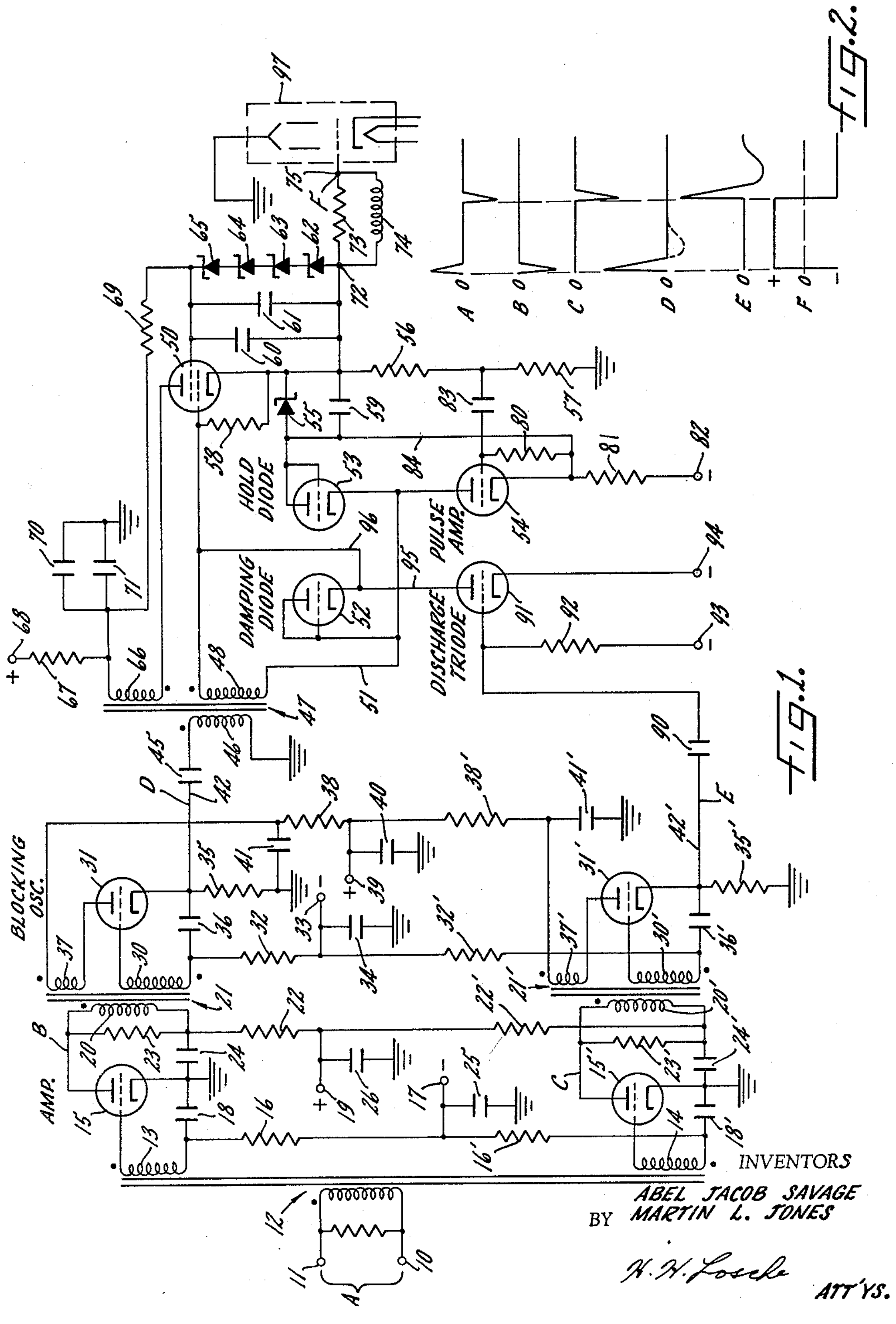
FIGURE 1 is a circuit schematic of a preferred embodiment of the invention.
FIGURE 2 is a set of time related waveforms occurring at various terminals of FIGURE 1.

Referring more particularly to FIGURE 1, with occasional reference to FIGURE 2 as appropriate, there is shown a circuit schematic diagram of the pulse generator in which an input to terminals 10 and 11 is to the primary winding of an input transformer 12 having two secondaries 13 and 14. The input signal applied to terminals 10 and 11 is shown by the waveform A in FIGURE 2 and may consist of time related pairs of positive and negative pulses in sequence, such as signals that may be produced by the differentiation of a square wave. Secondary winding 13 of transformer 12 has one lead coupled to the grid of a triode amplifier tube 15 and the other terminal coupled through a grid biasing resistor 16 to a negative voltage source applied at terminal 17. The junction of the secondary winding 13 and the grid biasing resistor 16 is coupled to a capacitor 18 having its opposite plate coupled to some fixed potential such as ground. The cathode of the triode amplifier 15 is directly coupled to the fixed potential and its anode is coupled to a positive anode voltage source at terminal 19 through a primary winding 20 of coupling transformer 21 and an anode load resistor 22 in series. Resistor 23 is coupled in parallel with the primary winding 20 of transformer 21. The common junction or resistor 23, winding 20, and resistor 22 is coupled to one plate of a capacitor 24, the opposite plate of which is coupled to the fixed potential such as ground. A capacitor 25 has its opposite plates coupled to the negative voltage source 17 and ground potential, and a capacitor 26 has its opposite plates coupled between the positive anode voltage source 19 and ground.

Coupling transformer 21 has a secondary winding 30 having one lead coupled to the control grid of a blocking oscillator triode tube 31 and its opposite lead coupled through a grid biasing resistor 32 to a negative voltage source terminal 33. The negative voltage source terminal 33 is coupled to one plate of a capacitor 34, the opposite plate of which is coupled to ground. The cathode of blocking oscillator triode 31 is coupled through a cathode resistor 35 to ground and also has one plate of a capacitor 36 coupled directly thereto and the opposite plate coupled to the junction of the secondary winding 30 and the grid biasing resistor 32. The anode of the triode 31 is coupled through a winding 37, which is in inductive relation with the secondary winding 30, and through an anode biasing resistor 38 to an anode voltage source 39. The anode voltage source 39 is coupled to one plate of the capacitor 40, the opposite plate of which is coupled to ground. The juncture of the anode load resistor 38 and the winding 37 is coupled to one plate of a capacitor 41, the other plate of which is coupled to ground. The output of the blocking oscillator is taken directly from the cathode on the output conductor 42.

The above description of the amplifier and blocking oscillator combination provides a driver circuit which is exactly duplicated in the circuit from the secondary winding 14 with the exception that the secondary windings 13 and 14 are oppositely polarized. In view of the similarity of elements and coupling arrangements in the lower amplifier and blocking oscillator providing a driver circuit as described for the above circuit, the elements of the lower circuit will be identified by the same reference characters primed ('). By this construction and arrangement the pulse input A, as shown by FIGURE 2, applied at the terminals 10 and 11 of input transformer 12 will cause amplification of the positive pulse in the upper driver circuit and the amplification of the negative pulse in the lower driver circuit to produce a sequence of positive pulses, respectively, from the upper and lower driver circuits. The purpose of the two driver circuits will become clear as the description proceeds and will be fully described in the description of operation.

The cathode output on the output conductor 42 from the upper driver circuit is capacitor coupled through a capacitor 45 to the primary winding 46 of a coupling transformer 47. The secondary winding 48 of transformer 47 has one lead coupled directly to the control grid of an output amplifier tetrode tube 50, and the other lead 51 coupled to the anode of a damping diode 52, to the cathode of a holding diode 53, and to the anode of a pulse amplifier triode tube 54. Damping diode tube 52 has a grid coupled directly to the anode which causes operation as a diode, and in like manner, the holding diode 53 has a grid coupled directly to the anode to make this tube likewise operate as a diode. The anode of the holding diode 53 is coupled through a Zener diode 55 to the cathode of the output amplifier tetrode 50, this cathode being coupled through cathode resistors 56 and 57 in series to the fixed potential, such as ground. The control grid of the output amplifier tetrode 50 is biased through the Zener diode 55, as will later become clear, and a resistor 58. The Zener diode 55 likewise has a capacitor 59 coupled in parallel therewith. The cathode of output amplifier tetrode 50 and the screen grid thereof are coupled in parallel to capacitors 60 and 61. The parallel coupling of capacitors 60 and 61 are paralleled in series by a plurality of Zener diodes, herein shown by diodes 62, 63, 64, and 65 to establish the proper screen grid potential of tetrode 50. The anode of the output amplifier 50 is coupled through a transformer winding 66 in inductive relation with the secondary winding 48 and through an anode load resistor 67 to an anode voltage source 68. The screen grid of the output amplifier tetrode 50 is coupled through a resistor 69 to the terminal of the anode load resistor 67 and the transformer winding 66. This terminal of resistors 67, 69, and winding 66 is connected to one plate each of parallel capacitors 70 and 71, the opposite plates of which are coupled to ground. The output of the output amplifier tetrode 50 is taken directly from the cathode thereof to terminal 72, this terminal being connected in parallel through a resistance 73 and an inductance 74 to an output terminal 75 to a point of use.

The pulse amplifying triode 54 has its grid coupled through a grid resistor 80 to the cathode thereof, the cathode being coupled through a cathode resistor 81 to a negative voltage source at terminal 82. This grid is likewise coupled to one plate of a capacitor 83, the opposite plate of which is coupled to the terminal junction of resistors 56 and 57. The cathode of pulse amplifier triode tube 54 is also coupled by a conductor 84 directly to the anode of the holding diode 53. The damping diode 52, holding diode 53 and pulse amplifier 54 and their functions will be more fully described in the description of operation below.

The output from the lower driver circuit on the output conductor 42' is capacitor coupled through the capacitor 90 to the control grid of a discharge triode 91. The grid of the discharge triode 91 is biased through a grid biasing resistor 92 from a negative voltage source supplied at terminal 93. The cathode of discharge triode 91 is directly coupled to a negative voltage source supplied at terminal 94, the negative voltage at terminal 93 being greater than the negative voltage at terminal 94. The anode of the discharge triode 91 is coupled by conductor means 95 directly to the cathode of the damping diode 52, the common anode-cathode coupling being connected directly to the control grid of the output amplifier tetrode 50 through the conductor means 96. The discharge triode operation will be given in the description of operation, infra.

The output terminal 75 of the pulse generator circuit may be coupled to any circuit in which high quality square waves are to be used but, for the purpose of illustration herein, is shown to be to the grid of the traveling wave tube illustrated within dotted lines 97. It is to be understood, however, that there are many uses and applications for high quality square waves and, accordingly, the output 75 can be connected to any such circuit and it is to be understood that the traveling wave tube is purely for example herein and is not to limit the use of the invention in any way.

*Operation*

In the operation of the circuit shown and described above for FIGURE 1 let it be assumed that paired pulses, such as shown by A in FIGURE 2, are applied to the input transformer 12. The transformer 12 is polarized as shown by the dots over the primary winding and the two secondary windings 13 and 14 which causes the first in sequence or positive pulse A to be applied as a positive pulse to the grid of the amplifier triode 15 and the negative pulse from the secondary 14 to be applied as a negative pulse to the grid of the amplifier 15'. By reason of the negative bias from the source 17 to the grids of the amplifiers 15 and 15', the positive pulse on the grid of amplifier 15 will cause tube conduction and amplification of this positive pulse to produce an inverted pulse B as shown in FIGURE 2 on its anode output. Since the amplifier triode 15' is negatively biased and the input pulse first in sequence of the waveform A is inverted in the secondary winding 14 to produce a negative pulse on the grid of the amplifier triode 15', this tube will remain cut off and no signal will be applied on the output thereof. The triode amplifier 15 will amplify the first in sequence of the pulses A in an inverted manner as shown by B by development of this signal across the anode load resistor 22 producing this pulse B across the primary winding 20 of transformer 21. The windings 20 and 30 of coupling transformer 21 are polarized, as shown by the dots, which produce an inverted pulse on the secondary 30 providing a positive pulse on the grid of the blocking oscillator tube 31. Since the blocking oscillator output is taken from the cathode, the input signal will be developed in an amplified form across the cathode resistor 35 to produce an amplified fast rising pulse as shown by D of FIGURE 2 on the cathode output 42. This fast rise time is aided by virtue of the blocking oscillator connection of the triode 31 having its anode coupled through a winding 37 in inductive relation with the secondary winding 30 and polarized reversely to the secondary winding 30 to induce back the voltage drop across the winding 37 inversely as a positive wave in the secondary winding 30 as readily understood by those skilled in the art of the operation of blocking oscillators. The blocking oscillator operation thereby assists in the development of an exceedingly fast rise time for the output pulse D on the output conductor 42.

The conductor 42, conducting the driver output pulse D, is coupled by the coupling transformer 47 through the primary and secondary windings 46 and 48 to the control grid of the output amplifier tetrode 50, which tetrode is likewise coupled as a blocking oscillator to further aid in speeding up the rise time of the pulse to develop on its cathode follower the leading edge of the output pulse F shown in FIGURE 2. The damping diode 52 dampens out the dotted line portion of the wave D shown in FIGURE 2 to eliminate "ringing" and backswings on the top of output pulse F that may be caused by overshoot. The secondary 48 and the anode winding 66 are polarized as shown by the dots to accomplish the aiding effect of the blocking oscillator circuit arrangement of the output amplifier tetrode 50 to speed up still more the rise time or leading edge of the output wave F. Prior to the application of the driver pulse D the cathode of the tetrode 50 was biased to the negative voltage from the negative voltage source 82 through the resistor 81, the conductor 84, and through the Zener diode 55 by exceeding the Zener voltage. The control grid of the tetrode 50 is biased below the cathode thereof by the coupling to the negative voltage source 82 through the pulse amplifier tube 54. Tube 54 is biased in a conductive state since grid voltage through resistor 80 is higher than the cathode voltage through resistor 81. Upon the application of the driver pulse D, the cathode voltage will follow or rise at which time this rise is reflected through the capacitor 59 to the anode of the holding diode 53 to cause conduction thereof or connection of the cathode of the tetrode 50 to the lead 51 of the secondary winding 48 through the Zener diode 55 bringing this secondary winding 48, and consequently, the control grid voltage of tube 50, up to near the cathode voltage, maintaining conduction of the tube. The grid-to-cathode voltage is brought to zero by the grid leak resistor 58 which is the normal operating state for tube 50. This voltage is raised to the level permissible by the voltage source 68 in circuit to the anode of tube 50 to bring the cathode voltage level to the plateau level of the output square wave F. This voltage will be held at this plateau level by the hold diode 53 connecting the cathode of tube 50 to its control grid until a discharging voltage is applied to the control grid of the tetrode 50. It is to be noted that when the cathode voltage of tube 50 rises the cathode of the pulse amplifier triode 54 will rise faster, by its direct connection through the conductor means 84 and capacitor 59 to the cathode of tube 50, than the grid voltage of the pulse amplifier 54, by reason of the coupling through resistor 56 and capacitor 83, whereby pulse amplifier 54, accordingly, will be and remain cut off during the rise time and during the plateau time of the output pulse F.

Upon the application of the next in sequence or negative pulse A from the input transformer 12, this pulse will be inverted in the secondary winding 14 to apply a positive pulse on the grid of the amplifier triode 15' to produce the negative pulse next in sequence on the anode output as shown by C in FIGURE 2. This negative pulse being applied as a negative pulse through the secondary winding 13 on the amplifier triode 15 will maintain this amplifier cut off or nonconductive. The pulse C on the anode of the triode amplifier 15' will be conducted through the transformer coupling of transformer 21' and be inverted in the secondary winding 30' to produce a positive pulse on the grid of the blocking oscillator tube 31' to produce the fast rise, high peaked pulse E on the cathode output 42' of the blocking oscillator 31' in the same manner as described for the driver circuit 13 through 42. The polarity of the various windings in the transformer coupling 21' are as shown by the dots. The driver pulse E will be applied through the capacitor 90 to the grid of the discharge triode 91 to overcome the negative bias on this tube and cause conduction to produce a fast decrease in voltage on the control grid of the tetrode tube 50 thereby tending to drop this grid voltage down toward the cathode voltage 94 of the discharge triode 91. The discharge triode 91 operates to short or rapidly drop the control grid voltage below the cathode voltage of output amplifier tube 50 to cause rapid cutoff. This immediately produces a drop in cathode voltage of the tetrode 50 which drop in voltage will be conducted through the capacitor 59 to the cathode of the pulse amplifier triode 54. This produces an immediate drop in voltage on the grid and anode of hold diode 53 and on the cathode of pulse amplifier 54 to cut off conduction of tube 53 and to make tube 54 conduct since the grid of tube 54 is held positive with respect to the cathode by the drop across resistor 56. Upon the conduction of the pulse amplifier triode 54, the secondary 48 by its lead 51 will be rapidly reduced in voltage toward the negative voltage source 82 which aids in reducing the control grid voltage on the tetrode 50 thereby producing a rapid fall time or trailing edge of the output pulse F. The pulse amplifier triode 54 thereby amplifies the voltage drop of the trailing edge of pulse F to reduce this voltage in the shortest possible time. By using the blocking oscillator circuits 31 and 31' in the driver circuits and by operating the tetrode 50 as a blocking oscillator, the rise time of the output voltage square wave pulse F has been reduced from time in microseconds to a time range of 6 to 20 nanoseconds, and the trailing edge fall time by virtue of the pulse amplifier 54 has been decreased from time in microseconds to a range of 15 to 30 nanoseconds. Thus, by decreasing the rise time and fall time periods, an output square wave F is produced that is nearer to a true square wave than heretofore known to be accomplished. While various values may be applied to the several circuit elements and components, this circuit may be constructed and arranged to develop an output square wave voltage of 500 volts rising from a negative 250 volts to a positive 250 volts then back to the negative 250 volts to produce the 500 volts square wave pulse.

While the invention is not limited in any way to any values of the various elements or voltages, values will be given herein merely for the purpose of example in carrying out an operative circuit arrangement but in no way limiting to applicants' invention. The following values may be used but may be changed to meet certain circumstances or applications:

| | Values |
|---|---|
| Capacitors: | |
| 18 and 18' | .005 μf. (microfarads). |
| 24 and 24' | .01 μf. |
| 25, 26, 34, and 40 | 50 μμf. (micromicrofarads). |
| 36 and 36' | .001 μf. |
| 41 and 41' | .005 μf. |
| 45 and 90 | 300 μμf. |
| 60 and 70 | 5 μf. |
| 61 and 71 | .02 μf. |
| 59 and 83 | .02 μf. |
| Resistors: | |
| 16 and 16' | 10K (K=1000). |
| 22 and 22' | 2.2K. |
| 23 and 23' | 2.2K. |
| 32 and 32' | 1K. |
| 35 and 35' | 470. |
| 38 and 38' | 1K. |
| 56 | 100K. |
| 57 | 50K. |
| 67 | 1K. |
| 69 | 60K. |
| 73 | 200. |
| 80 | 82K. |
| 81 and 92 | 47K. |
| Inductances: | |
| 74 | 8 microhenries (μh.). |
| Voltages: | |
| 17 | −22. |
| 19 | 330. |
| 33 | −45. |
| 39 | 600. |
| 68 | 1000. |
| 82 and 93 | −600. |
| 94 | −500. |

With these values the cathode of the output amplifier tetrode 50 will be held approximately at a −250 volts in the quiescent state of the circuit and will be driven to approximately +250 volts, as limited by the 1 kilovolt source 68 to establish the plateau of the square wave output pulse F. Other values may be utilized for the capacitors, resistors, and inductance elements or the diodes 62 through 65 to establish different voltage levels for the output square wave, where desired.

Many modifications and changes may be made in the constructional details and features of this invention to provide similar results, as by using the output amplifier 50 as a straight amplifier and not as a blocking oscillator. Also, a triode could be used in place of the tetrode 50 as a blocking oscillator or as a straight amplifier without departing from this invention. The departure from using a blocking oscillator for the tetrode or triode circuit would increase the rise time somewhat but would operate successfully. While these and other modifications can be made without departing from the invention, it is to be understood that we desire to be limited only by the spirit and scope of the appended claims.

We claim:

1. A generator of fast rise and fall time square wave pulses comprising:

a pair of driver-amplifier circuits responsive to oppositely poled first and second input signals to produce amplified output signals on an output of each in the sequence of the oppositely poled signals;

an output amplifier tube circuit having a grid coupled to the output of one of said driver-amplifiers responding to the first of said sequence of poled input signals, and having a cathode output;

a first means coupled to said cathode output responsive to a rise in cathode output voltage to a raised level as a result of said first input signal to produce said driver-amplifier output signal to connect the cathode to the grid of said output amplifier to hold said cathode output voltage at said raised level; and a second means coupled to said output amplifier tube circuit grid and to the output of said other driver-amplifier circuit in response to the second in sequence of said input signals to short said output amplifier whereby a square wave is produced on the cathode output with fast rise and fall leading and trailing edges with a flat top sustained by said first means.

2. A generator of fast rise and fall time square wave pulses comprising:

a pair of driver-amplifier circuits responsive to oppositely poled first and second input signals to produce amplified first and second output signals respectively from each driver-amplifier in the sequence of the input oppositely poled signals;

an output amplifier tube circuit having a grid coupled to the output of one of said driver-amplifiers responding to the first of said sequence of poled input signals to produce a raised voltage level on a cathode output thereof;

a first means coupled to said cathode output responsive to said raised voltage level as a result of said one driver-amplifier output first signal to connect the cathode to the grid of said output amplifier to hold said cathode output voltage at said raised level;

a second means coupled to said output amplifier tube circuit grid and to the output of the other driver-amplifier circuit to receive said second output signal in response to the second in sequence of said input signals to remove said raised level voltage on the grid of said output amplifier and cause a voltage drop on said cathode output; and a pulse amplifier coupled across the grid and cathode output of said output amplifier and responsive to said voltage drop on said cathode output to drop said raised voltage level on said grid and to amplify the drive of said cathode output voltage down rapidly upon the application of said other driver-amplifier second output signal whereby square wave voltage pulses with fast rise and fall leading and trailing edges are produced on said cathode output.

3. A generator of fast rise and fall time square wave pulses as set forth in claim 2 wherein said coupling of said output amplifier grid with said one of said driver-amplifiers is through a transformer, the secondary of which couples said grid and which secondary has a damping diode thereacross to dampen out signal overshoots.

4. A generator of fast rise and fall time square wave a pair of amplifiers responsive to amplify positive pulses;

a pair of blocking oscillators;

a first transformer coupling an input of positive and negative pulse signals to said pair of amplifiers in opposite polarity relation to make one amplifier responsive to positive pulse signals from positive pulse signals applied to said first transformer and the other amplifier responsive to positive pulse signals from negative pulse signals applied to said first transformer;

second and third transformers coupling one each amplifier with one each blocking oscillator;

an output amplifier having a grid input and a cathode output;

a fourth transformer coupling the output of said blocking oscillator coupled to said one amplifier with the grid input of said output amplifier to produce a voltage raised level on said cathode output when a positive pulse signal is applied to said first transformer input;

first means coupled to said cathode output and said output amplifier grid responsive to said voltage raised level on said cathode output to hold said grid voltage of said output amplifier at said raised level; and a second means coupled to said output amplifier grid and to the output of said blocking oscillator coupled to said other amplifier to discharge the raised level voltage on the grid of said output amplifier upon the application of a negative pulse signal at said first transformer to cause said voltage level to fall on said cathode output whereby a square wave is generated at said cathode output with fast rise and fall leading and trailing edges corresponding in time to said positive and negative pulse signals applied at said first transformer.

5. A generator of fast rise and fall time square wave pulses as set forth in claim 4 wherein said first means is a Zener diode and vacuum tube diode combination coupled between said cathode and grid of said output amplifier tube to cause the cathode raised voltage level to hold the grid voltage at the raised voltage level until said grid is discharged by said second means.

6. A generator of fast rise and fall time square wave pulses as set forth in claim 5 wherein said second means is a triode tube having an anode coupled to said output amplifier grid, a cathode coupled to a negative voltage source, and a grid coupled to said blocking oscillator coupled to said other amplifier.

7. A generator of fast rise and fall time square wave pulses as set forth in claim 6 wherein said output amplifier tube is a tetrode, the screen grid thereof being coupled to a voltage supply and to the cathode thereof through a diode means to limit the voltage level on said screen grid.

8. A generator of fast rise and fall time square wave pulses as set forth in claim 7 wherein said fourth transformer couples the grid of said output amplifier through its secondary, the secondary of which is damped in overshoot oscillations by a damping diode across said secondary.

9. A generator of fast rise and fall time square wave pulses as set forth in claim 8 wherein said fourth transformer secondary coupling to said output amplifier grid includes a triode pulse amplifying tube network with an anode thereof coupled to said secondary, a grid coupled through a capacitor and a resistor in series to said cathode output, and a cathode capacitor coupled to said cathode output and through a cathode resistor to a negative voltage source whereby a drop in cathode output raised voltage level of said output amplifier is amplified through said triode pulse amplifying tube network to rapidly reduce the voltage on said output amplifier grid to produce a rapid fall time trailing edge of said generated square wave pulse.

10. A generator of fast rise and fall time square wave pulses comprising:

an input transformer having a primary winding for receiving positive and negative pulses in a predetermined time sequence in that order and having two secondaries oppositely polarized;

a pair of amplifiers, one each coupled to one each of said input transformer secondaries to cause one of said amplifiers to amplify a positive input pulse and to cause the other amplifier to amplify the negative input pulse, in that order of occurrence, on the respective outputs thereof;

a pair of blocking oscillators, one coupled to said one amplifier output and the other coupled to said other amplifier output to produce a sharp rise, high amplitude positive pulse on said one blocking oscillator output corresponding to each positive input pulse, and a sharp rise, high amplitude positive pulse on said other blocking oscillator output corresponding to said negative input pulse, said one amplifier and one blocking oscillator and said other amplifier and other blocking oscillator each constituting a driver circuit;

an output amplifier tube circuit having a control grid input, a screen grid and an anode coupled to an anode voltage source, and a cathode output to produce a raised voltage level thereon when a positive voltage pulse is applied to said control grid, said screen grid and cathode being coupled through diodes to provide a limited screen grid potential for said output amplifier;

a coupling transformer coupling the output of said one blocking oscillator to the control grid of said output amplifier through a secondary winding;

a discharge triode having a grid coupled to the output of said other blocking oscillator, an anode coupled to the control grid of said output amplifier, and a cathode coupled to a negative voltage source to discharge control grid voltage on said output amplifier and cut off conduction;

a damping diode coupled cross the secondary of said coupling transformer to dampen positive pulse overswings of said one blocking oscillator output;

a hold diode having an anode coupled to said cathode output and a cathode coupled to said coupling transformer secondary to hold the control grid voltage of said output amplifier at the raised voltage level of said cathode output subsequent to a positive pulse input applied to said control grid; and a pulse triode amplifier having an anode coupled to said coupling transformer secondary, a grid coupled through a capacitor and a resistance in series to said cathode output, and a cathode coupled through a capacitor to said cathode output and through a resistance to a negative voltage source to rapidly reduce cathode output voltage upon discharge of said raised voltage level on said output amplifier control grid and cutoff of said output amplifier whereby a fast rise time leading edge is generated by operation of said positive input pulse to a predetermined clamped amplitude where it remains until discharge by operation of said negative input pulse to produce a substantially optimal square wave on said cathode output.

11. A generator of fast rise and fall time square wave pulses as set forth in claim 10 wherein said hold diode has a Zener diode in its anode coupling to said cathode output, oriented with the anode thereof coupled to the hold diode anode and the cathode thereof coupled to said output cathode, to maintain a bias on said output cathode and to pass a control voltage to said hold diode.

12. A generator of fast rise and fall time square wave pulses as set forth in claim 11 wherein said output amplifier is coupled as a blocking oscillator amplifier, said output anode being coupled through a transformer winding to said anode voltage source, said transformer winding being in inductive relation to said coupling transformer secondary and in opposite polarity thereto.

13. A generator of fast rise and fall time square wave pulses as set forth in claim 12 wherein said one amplifier and one blocking oscillator in one driver channel and said other amplifier and other blocking oscillator in the other driver channel are each transformer coupled.

No references cited.

ARTHUR GAUSS, *Primary Examiner.*